(12) United States Patent
Kleideiter et al.

(10) Patent No.: US 9,960,020 B2
(45) Date of Patent: May 1, 2018

(54) METHOD AND APPARATUS FOR SAVING ENERGY WHILE INCREASING THE CONVEYING SPEED IN VACUUM COATING PLANTS

(71) Applicant: GRENZEBACH MASCHINENBAU GMBH, Asbach-Baeumenheim (DE)

(72) Inventors: Gerd Kleideiter, Ahaus (DE); Thomas Krisch, Linsengericht / Luetzelhausen (DE); Joerg Fiukowski, Torgau (DE); Olaf Gawer, Dresden (DE)

(73) Assignee: GRENZEBACH MASCHINENBAU GMBH, Asbach-Baeumenheim (DE)

( * ) Notice: Subject to any disclaimer, the term of this patent is extended or adjusted under 35 U.S.C. 154(b) by 0 days. days.

(21) Appl. No.: 15/328,818

(22) PCT Filed: Aug. 5, 2015

(86) PCT No.: PCT/DE2015/000397
§ 371 (c)(1),
(2) Date: Jan. 24, 2017

(87) PCT Pub. No.: WO2016/023533
PCT Pub. Date: Feb. 18, 2016

(65) Prior Publication Data
US 2017/0213708 A1   Jul. 27, 2017

(30) Foreign Application Priority Data
Aug. 11, 2014   (DE) .................. 10 2014 011 877

(51) Int. Cl.
C23C 14/34   (2006.01)
H01J 37/32   (2006.01)
(Continued)

(52) U.S. Cl.
CPC ........ *H01J 37/32834* (2013.01); *C23C 14/52* (2013.01); *C23C 14/562* (2013.01);
(Continued)

(58) Field of Classification Search
CPC ........... H01J 37/32761; H01J 37/32779; H01J 37/32788; H01J 37/32889; H01J 37/32899
See application file for complete search history.

(56) References Cited

U.S. PATENT DOCUMENTS 5,407,551 A    4/1995  Sieck et al.
5,705,044 A *  1/1998  Washburn ............. C23C 14/352
                                              204/298.03
(Continued)

FOREIGN PATENT DOCUMENTS

DE   19736318    2/1999
DE   10122310    11/2002
(Continued)

*Primary Examiner* — Jason Berman
(74) *Attorney, Agent, or Firm* — Duane Morris LLP; J. Rodman Steele, Jr.; Gregory M. Lefkowitz (57) ABSTRACT

Disclosed are an apparatus and a method for saving energy while increasing the conveying speed in vacuum coating plants consisting of a series of sputtering segments (3) and gas separation segments (2) along with a continuous substrate plane (1). Said apparatus has the following features: a) each of the sputtering segments (3) consists of a tank tub (12) inside which a conveying device (11) is located; the flange (6) of the tank is positioned in the immediate vicinity above the substrate plane (1); a cathode bearing block (5), along with targets (8) and gas inlet ducts (10), is located in the tank cover (4) in the immediate vicinity of the substrate together with splash guards (9); b) in the region of the substrate plane (1), the gas separation segments (2) are provided with a tunnel cover (14) that extends along the entire length of the gas separation segment (2); c) sputtering (Continued)

segments (3) and/or gas separation segments (2) are evacuated using one or more vacuum pumps (15), and the air pumped in said process is trapped in an air reservoir (25) having an adjustable volume.

9 Claims, 8 Drawing Sheets

(51) Int. Cl.
  *H01J 37/34* (2006.01)
  *C23C 14/56* (2006.01)
  *C23C 14/52* (2006.01)
(52) U.S. Cl.
  CPC ...... *C23C 14/564* (2013.01); *H01J 37/32513* (2013.01); *H01J 37/32761* (2013.01); *H01J 37/32779* (2013.01); *H01J 37/32788* (2013.01); *H01J 37/32889* (2013.01); *H01J 37/32899* (2013.01); *H01J 37/3408* (2013.01)

(56) References Cited

U.S. PATENT DOCUMENTS

| | | | |
|---|---|---|---|
| 6,235,171 B1 * | 5/2001 | Yamamoto | B82Y 25/00 |
| | | | 118/719 |
| 8,075,691 B2 * | 12/2011 | Lee | H01L 21/67126 |
| | | | 118/715 |
| 2005/0199185 A1 | 9/2005 | Richert et al. | |
| 2008/0283393 A1 | 11/2008 | Erbkamm et al. | |
| 2011/0308458 A1 * | 12/2011 | Sung | C23C 16/45565 |
| | | | 118/719 |

FOREIGN PATENT DOCUMENTS

| | | |
|---|---|---|
| DE | 10322935 | 12/2004 |
| DE | 102012110334 | 11/2013 |
| JP | 2002081857 | 3/2002 |
| WO | 2006074624 | 7/2006 |

* cited by examiner

METHOD AND APPARATUS FOR SAVING ENERGY WHILE INCREASING THE CONVEYING SPEED IN VACUUM COATING PLANTS

CROSS-REFERENCE TO RELATED APPLICATIONS

This application is a § 371 national stage entry of International Application No. PCT/DE2015/000397, filed on Aug. 5, 2015, which claims priority to German Patent Application No. 10 2014 011 877.0, filed on Aug. 11, 2014, the entire contents of which are incorporated herein by reference.

The invention relates to a method and an apparatus for saving energy and simultaneously increasing the throughput speed in vacuum coating installations.

Magnetic-field assisted magnetron sputtering has expanded into many fields of modern surface technology. Proceeding from applications in microelectronics, magnetic-field assisted magnetron sputtering is now established as an industrial coating method for architectural glass, flat screens, spectacle lenses, tape materials, tools, decorative articles and functional components. In this case, functional components are often provided with corrosion protection or hard material coatings composed of nitrides such as TiN, TaN, VN, ZrN or carbonitrides such as TiCN using single-layer or multilayer technology. Superhard coatings based on nano-multilayer coatings with hardness values up to 50 GPa are also increasingly being used. In the automotive industry, friction- and wear-reducing metal/carbon coatings have proved highly successful.

The largest vacuum-coating installations, and thus often also the installations with the highest energy requirements, are the typical horizontal inline installations for architectural glass coating.

Reference is made to the following documents from the prior art:

DE 10 2012 110 334 B3 discloses a planar magnetron which is based on the objective of creating a planar magnetron which does not have the disadvantages of the prior art and with which in particular a more uniform magnetic field is achieved. The disadvantages listed relate in that case to the prior art disclosed in U.S. Pat. No. 5,407,551 A.

Claim 1 relates in that case to a planar magnetron for vacuum coating installations for coating glass plates or other flat substrates, having a magnet arrangement that consists of a magnetizable yoke plate with longitudinally extending pole shoes integrally formed thereon and associated permanent magnets, and having at least one target on the magnet arrangement, and also cooling ducts for passing a coolant fluid through the planar magnetron.

Said planar magnetron is characterized in that the yoke plate has a constant cross section along its entire length and is provided with receptacles, extending longitudinally in the yoke plate, for fastening attachment parts, such as at least one cooling duct with a feed line and return line and claw strips for fastening at least one target.

Furthermore, DE 101 22 310 A1 describes an elongate vacuum coating installation which is based on the objective of improving the accessibility to the glass transporting plane in elongate vacuum coating installations in order to make maintenance easier and more cost-effective.

In an elongate vacuum coating installation for coating flat substrates that are moved in a transporting direction, this objective is achieved with at least one coating module which has at least two coating sections located in succession in the transporting direction, and a transporting system above which there is a transporting space for the substrates. In that case, the transporting space extends through the coating sections via substrate guide slots in the walls of the coating sections, wherein the coating sections each have a cover which closes a cover opening and to which at least one magnetron is fastened such that it is arranged above the transporting space, and wherein the coating sections are evacuable by means of vacuum pumps via vacuum guide ducts.

Said vacuum coating installation is characterized in that the vacuum coating installation is divided, above the transporting space, into a chamber lower part common to all the coating sections of a coating module and into a chamber upper part common to all the coating sections of a coating module, both chamber parts are able to be closed in a vacuum-tight manner with one another in the working position and are movable relative to one another in the maintenance position.

What is decisive for stable and efficient process control is the arrangement of the cathode relative to the substrate. The overall geometry of the arrangement has an effect on the quality and the productivity of the coating. In that case, the arrangement of the cathodes and anodes, the aperture diaphragms, the transporting rollers, the gas distribution and the magnetic field arrangement should be mentioned, above all. Known solutions for energy-saving coating installations often have the disadvantage that they do not exhibit the technically best solution for at least one of the above features. Specifically, the gas path is often not arranged directly and above the substrate, since the accessibility to and maintenance of said gas guidance systems is highly restricted by the closeness to the substrate and to the transporting system.

The present invention is based on the object of specifying a method and an apparatus for saving energy and simultaneously increasing the throughput speed in vacuum coating installations. In this way, the productivity and service life of such an installation is intended to be improved.

This object is achieved by the apparatus as claimed in claim 1:

An apparatus for saving energy and simultaneously increasing the throughput speed in vacuum coating installations which consist of a sequence of sputtering segments (3) and gas separating segments (2) with a continuous substrate plane (1), having the following features:

a) the sputtering segments (3) each consist of a tank tub (12) with an internal transporting device (11) for transporting substrates (1) and at least one tank cover (4) which is connected to the tank tub (4) by means of a tank flange (6), wherein the tank flange (6) is positioned in the immediate vicinity above the substrate plane (1) and wherein a cathode bearing block (5) with targets (8) and gas inlet ducts (10) is located in the immediate vicinity of the substrate with splash guards (9) in the tank cover (4), b) the gas separating segments (2) have, in the region of the substrate plane (1), a tunnel cover (14) which extends along the entire length of the gas separating segment (2) and which can be adapted to the thickness of the respective substrate (1) by means of a plurality of lifting and lowering elements (17) such that only a small clearance gap (18) remains vertically between the substrate (1) and the tunnel cover (14), c) sputtering segments (3) and/or gas separating segments (2) are evacuated by means of one or more vacuum pumps (15), wherein the air conveyed in the process is collected in a variable-volume air reservoir (25) and, when the relevant segment (3, 2) is subsequently aerated again, is delivered back into this segment (3, 2).

It is also claimed:

that, in the upper region of the tank cover (4), in order to monitor the coating process, a plurality of detection elements (32) can be displaced on a locating device and can be rotated with regard to their detection range regardless of location.

It is claimed:

that the bearing block (5) has a multiple cathode in the form of two double targets located one above the other, wherein these are mounted so as to be rotatable about a common rotation axis (37) together with their splash guards (9), and wherein four different coating configurations are allowed.

It is claimed:

that in each case two chambers (41, 42) located next to one another are sealed off from the exterior by means of a sealing ring (40) that extends around the entire periphery, wherein an outer sealing strip (39) is additionally provided in this region, and wherein the space between the sealing ring (40) and the sealing strip (39) is monitored by a vacuum sensor (38).

Object also achieved by the method as claimed in claim 5:

A method for saving energy and simultaneously increasing the throughput speed in vacuum coating installations which consist of a sequence of sputtering segments (3) and gas separating segments (2) with a continuous substrate plane (1), having the following features:

a) in order to carry out the method, use is made of sputtering segments (3) in which the tank flange (6) for connecting the tank tub (12) and the tank cover (4) is positioned in the immediate vicinity above the substrate plane (1) in order that, in the event of process changes and maintenance work, the entire tank cover (4) with all the components located therein can be changed quickly in a time-saving and cost-effective manner, b) the gas separating segments (2) are provided along their entire length with a tunnel for delimiting the respective substrate with respect to the adjoining region of the gas separating segment (2), wherein the height of the tunnel can be adapted to the thickness of the respective substrate in such a way that the location of the tunnel cover (14) is changed by means of a plurality of lifting and lowering elements (17) such that a minimum clearance gap remains between the substrate and the tunnel cover (14), c) sputtering elements (3) and/or gas separating segments (2) are evacuated by means of one or more vacuum pumps (15), wherein the air conveyed in the process is collected in a variable-volume air reservoir (25) and, when the relevant segment (3, 2) is subsequently aerated again, is delivered back into this segment (3, 2), in order that the air that has already been conditioned once can be utilized again in a time-saving and cost-effective manner.

It is claimed:

that, in order to monitor the coating process in real time, in the upper region of the tank cover (4), in order to monitor the coating process, a plurality of detection elements (32) can be displaced on a locating device and can be rotated with regard to their detection range regardless of location.

Moreover, it is claimed:

that, in order to optimize the coating process, the bearing block (5) has a multiple cathode in the form of two double targets located one above the other, wherein these are mounted so as to be rotatable about a common rotation axis (37) together with their splash guards (9).

A computer program is claimed having a program code for carrying out the method steps when the program is run on a computer. Claimed furthermore is a machine-readable carrier having the program code of a computer program for carrying out the method as claimed in one of claims 5 to 7 when the program is run on a computer.

The apparatus according to the invention is described in more detail in the following text.

Specifically.

Figure 1:
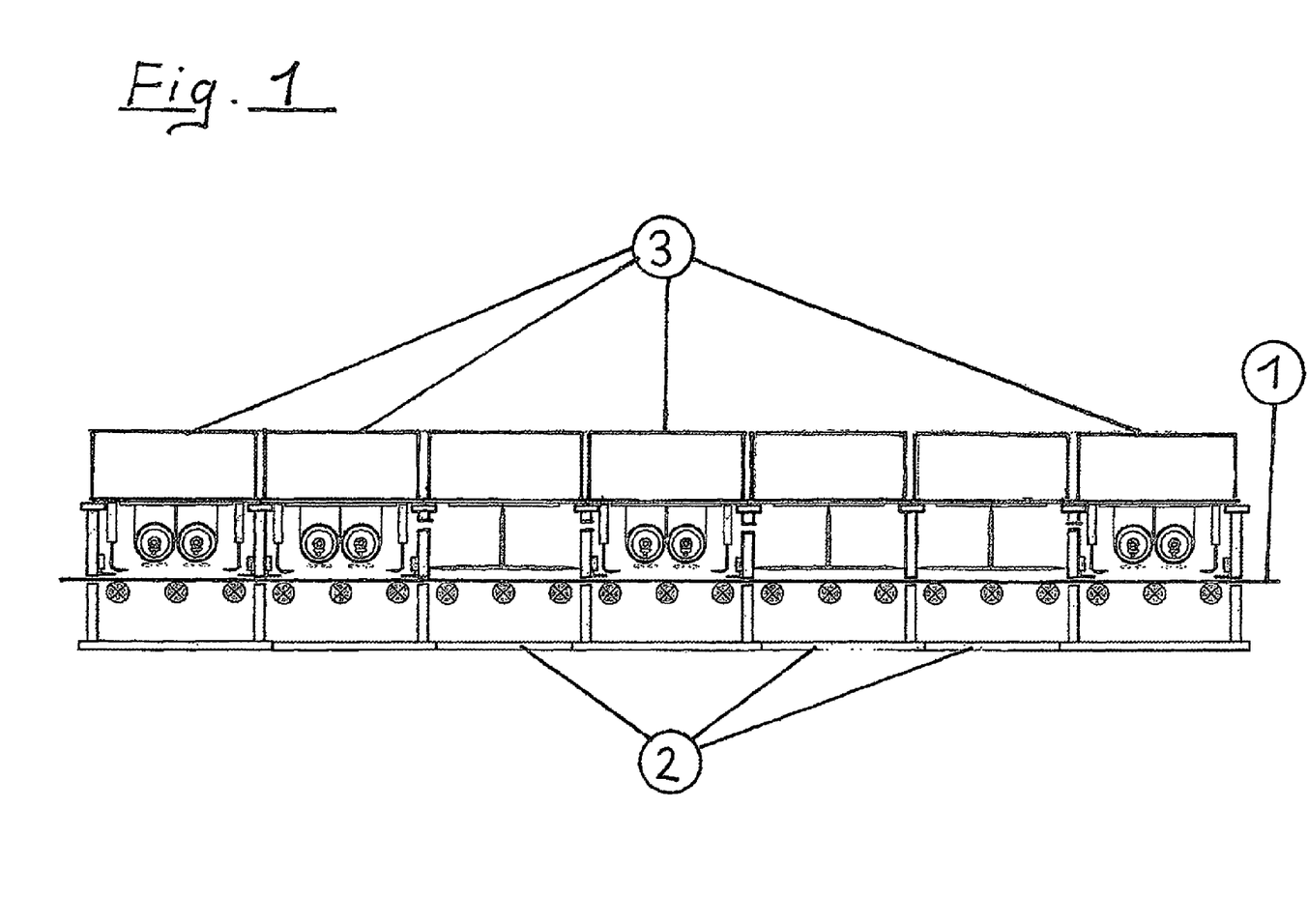
FIG. 1: shows the basic structure of a vacuum coating installation

A vacuum coating installation consists substantially of a sequence of sputtering segments 3 and gas separating segments 2. The substrates to be coated are in this case conveyed from one segment to the next segment on the illustrated substrate plane 1.

Figure 2:
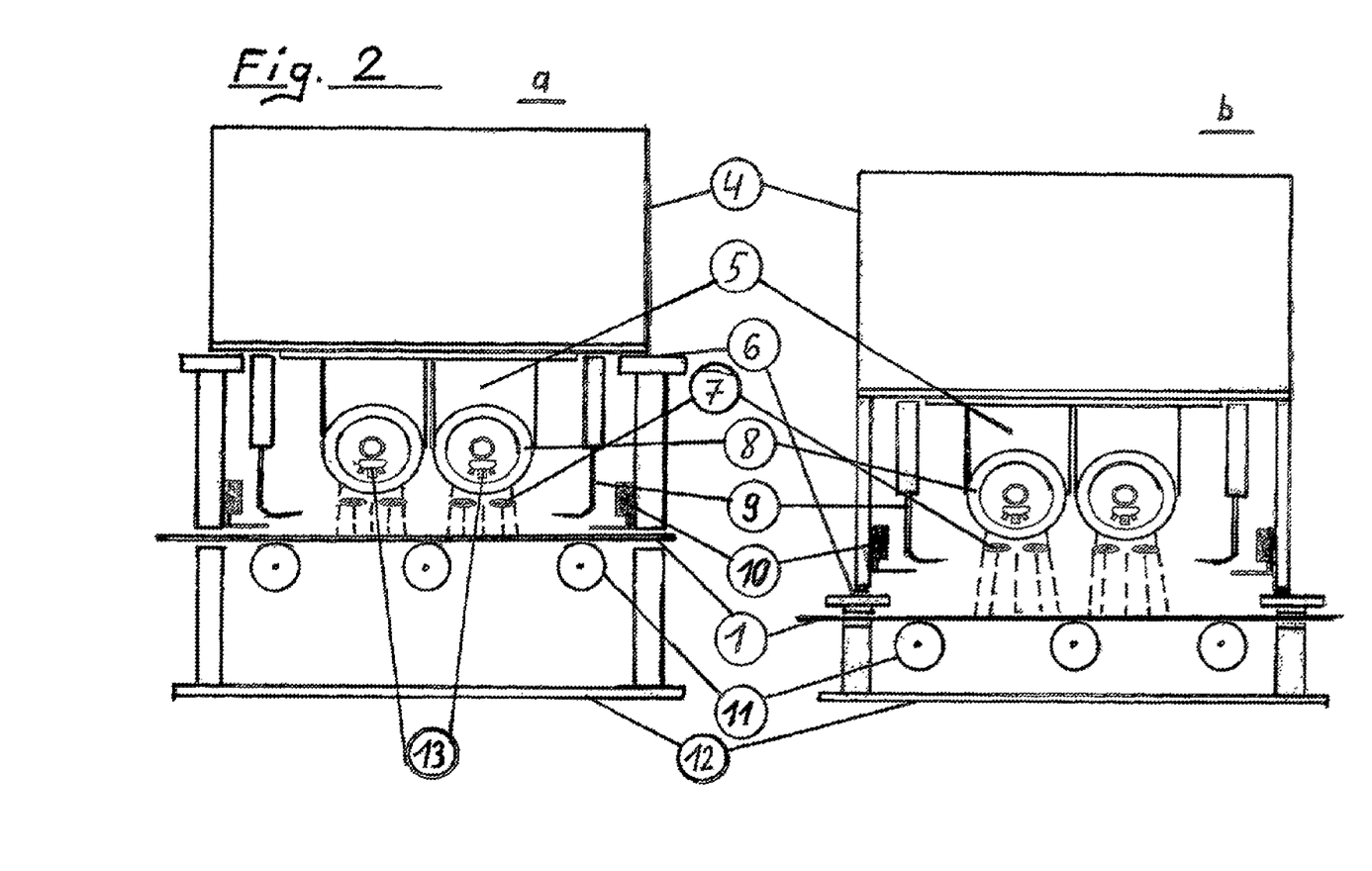
FIG. 2: shows a comparison of two arrangements of tanks

FIG. 2 shows a comparison of two arrangements of tanks.

In FIG. 2*a*), the conventional construction of a sputtering tank is illustrated in cross section, while in FIG. 2*b*), the construction according to the invention is shown in cross section.

The difference between the two constructions with regard to the plane of the respective cover flange 6 is obvious here. While, in the conventional construction on the left-hand side, the cover flange 6 is positioned relatively high, this is not the case for the construction on the right-hand side. The reason for this is that, in the conventional construction, the splash guards 9, shown on the left-hand and on the right-hand side, of the sputtering region screen are removed from the two bearing flanges 6 together with the two cathode bearing blocks 5 when the tank cover 4 is changed, but the gas inlet ducts 10, shown on the left and the right, in the main body of the coating tank remain. Since, each time the tank cover 4 is changed, extensive and time-consuming cleaning work arises, in the conventional design according to FIG. 2*a*), a high cost factor has to be allowed for. In the construction according to the invention according to FIG. 2*b*), a tank cover 4 can be changed much more rapidly, however, since the gas inlet ducts, as an integrated constituent of a tank cover 4, can be cleaned carefully, calmly and cost-effectively together with the other constituents of a tank cover during a preceding or following sputtering process. Furthermore, the respective tank tub 12 and the transporting device 11 for transporting the substrates 1 are indicated in FIG. 2. Moreover, the target units 8 with the associated plasma regions 7 and the respective magnetic bar 13 are marked in the conventional construction.

Figure 3:
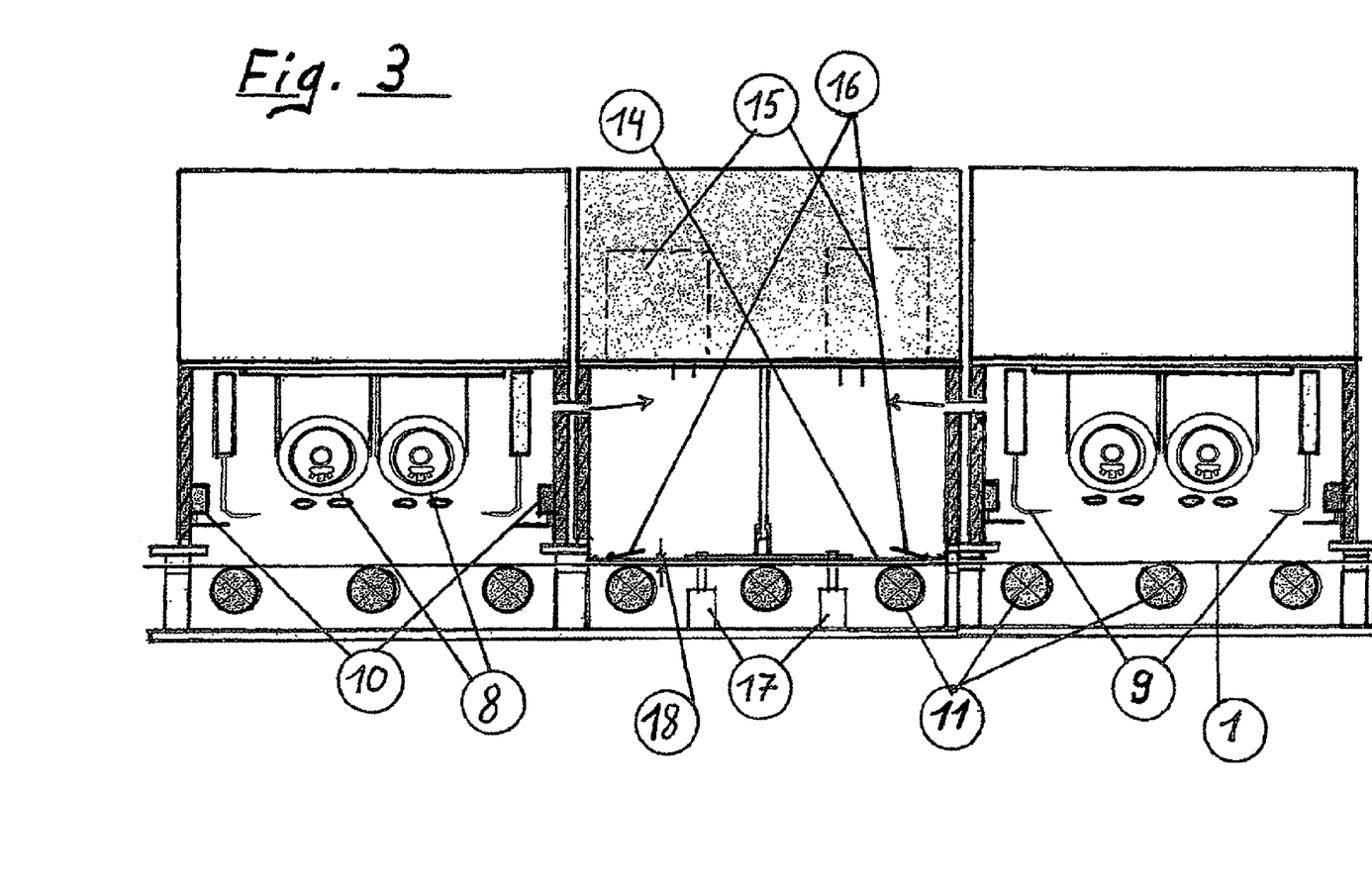
FIG. 3: shows a detail view of typical segments from FIG. 1

FIG. 3 shows a detail view of typical segments from FIG. 1.

The segments shown here each consist on the right and left of a sputtering segment, wherein these two sputtering segments are separated by a gas separating segment. On the substrate plane 1 that is common to all the segments, these segments are passed through by the respective substrate to be coated. Since a different coating process with a different target and a different gas mixture generally takes place in each sputtering segment, a gas separating segment is interposed between the two sputtering segments in the example shown, in order to prevent the gas mixture from one sputtering segment from coming into contact with the gas mixture from the other sputtering segment.

In the left-hand sputtering segment in FIG. 3, the two targets 8 and the two gas inlet ducts 10 are indicated. In the right-hand sputtering segment, the two splash guards of the sputtering region screen 9 and two running rollers of the transporting device 11 for transporting the relevant substrate are identified in particular. In the central gas separating segment, two vacuum pumps 15 that are assigned to the respective adjacent sputtering segment by means of a partition plate through feed ducts, are shown in the tank cover. Illustrated as a particular feature here in the region of the substrate plane 1 are two lifting and lowering elements 17 for what is referred to as a tunnel cover 14. This is an arrangement which makes it possible to screen the tunnel cover 14, which the substrate passing through over the entire length and width of the substrate, from the remaining space of the gas separating segment and to lift or lower it according to the different thickness of the substrate passing through in each case to such an extent that what is referred to as the clearance gap is at a minimum. The clearance gap 18 is thus the spacing between the substrate and the tunnel cover 14, covering the substrate, which is absolutely necessary for undisturbed passage of the respective substrate. In this case the thickness of the substrate passing through in each case is determined promptly by a sensor, not designated further, and the control signal thus obtained is used to control the lifting and lowering elements 17. In the region of the partition walls of the gas separating segment shown, a respective tunnel-cover flap acting as a nonreturn valve in order to prevent mixed gas from flowing in out of the respectively adjacent segment is located at the level of the substrate plane.

Figure 4:
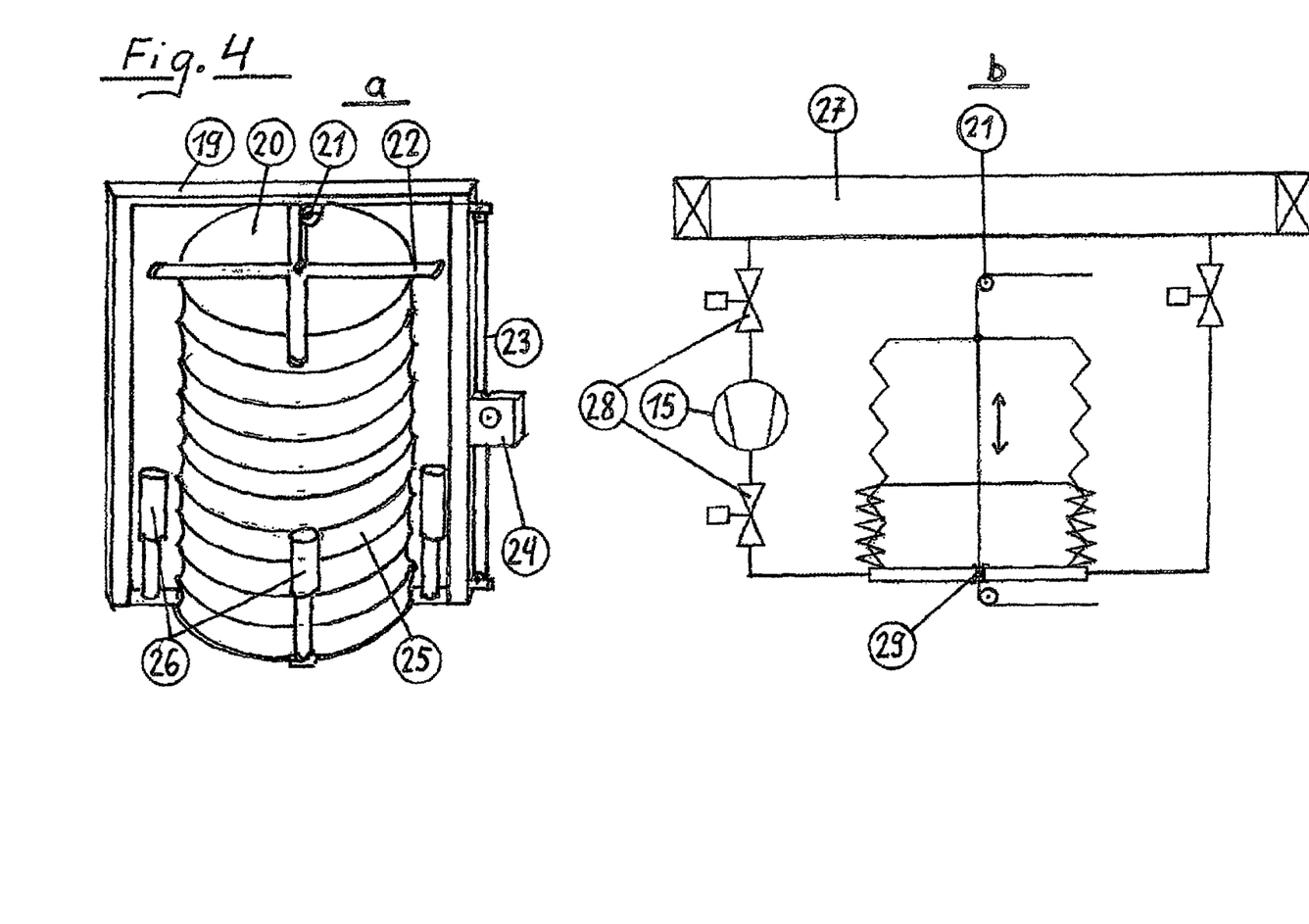
FIG. 4: shows the basic structure of a vacuum reservoir 25

FIG. 4 shows the basic structure of a vacuum reservoir 25.

FIG. 4a) in this case shows for example a technical embodiment of the basic functional principle shown in FIG. 4b).

The respective vacuum chamber 27 is evacuated by means of one or more vacuum pumps 15. The air conveyed through the vacuum pump 15 in the process is collected in a variable-volume air reservoir 25. As a rule, the variable-volume air reservoir 25 is designed such that it is inflated by the pressure generated by the vacuum pump 15.

In the subsequent aerating of the vacuum chamber 27, the air stored in the variable-volume air reservoir 25 is delivered back into the vacuum chamber 27 by the negative pressure. The advantage of the solution illustrated in FIG. 4b) is that air that has already been conditioned once and has a particular degree of dryness is reused and thus it is possible to dispense with equipment for drying new air. The illustrated shut-off valves 28 serve to control the air flows.

The flowing-in operation of the air stored in the variable-volume air reservoir 25 during the aeration of the vacuum chamber 27 can be promoted by a force that acts on the air reservoir 25 and supports the reduction in its volume. This is achieved for example by means of a cover cross 22 attached to the reservoir cover 20 in the upper region of the air reservoir 25, wherein this cover cross 22 is pulled down by a tension cable 23, which extends through a tension-cable sealing element 29 in the base of the air reservoir 25 and a further deflection roller (not indicated in more detail), and runs back to a tension-cable drive element 24.

In this case, the air reservoir 25 can be fixed in its position by means of a deflection roller 21 fastened to a reservoir gantry 19.

For additional force support during the operation of a further subsequent evacuation of the vacuum chamber 27, four spring elements 26 can be provided in the lower region of the air reservoir 25, which cooperate in their position with the cover cross 22 such that they are compressed by means of the tension cable 23 and thus act as energy stores. The energy stored in this way in the spring elements 26 can thus support the work of the vacuum pump 15 in the following evacuation process.

Figure 5:
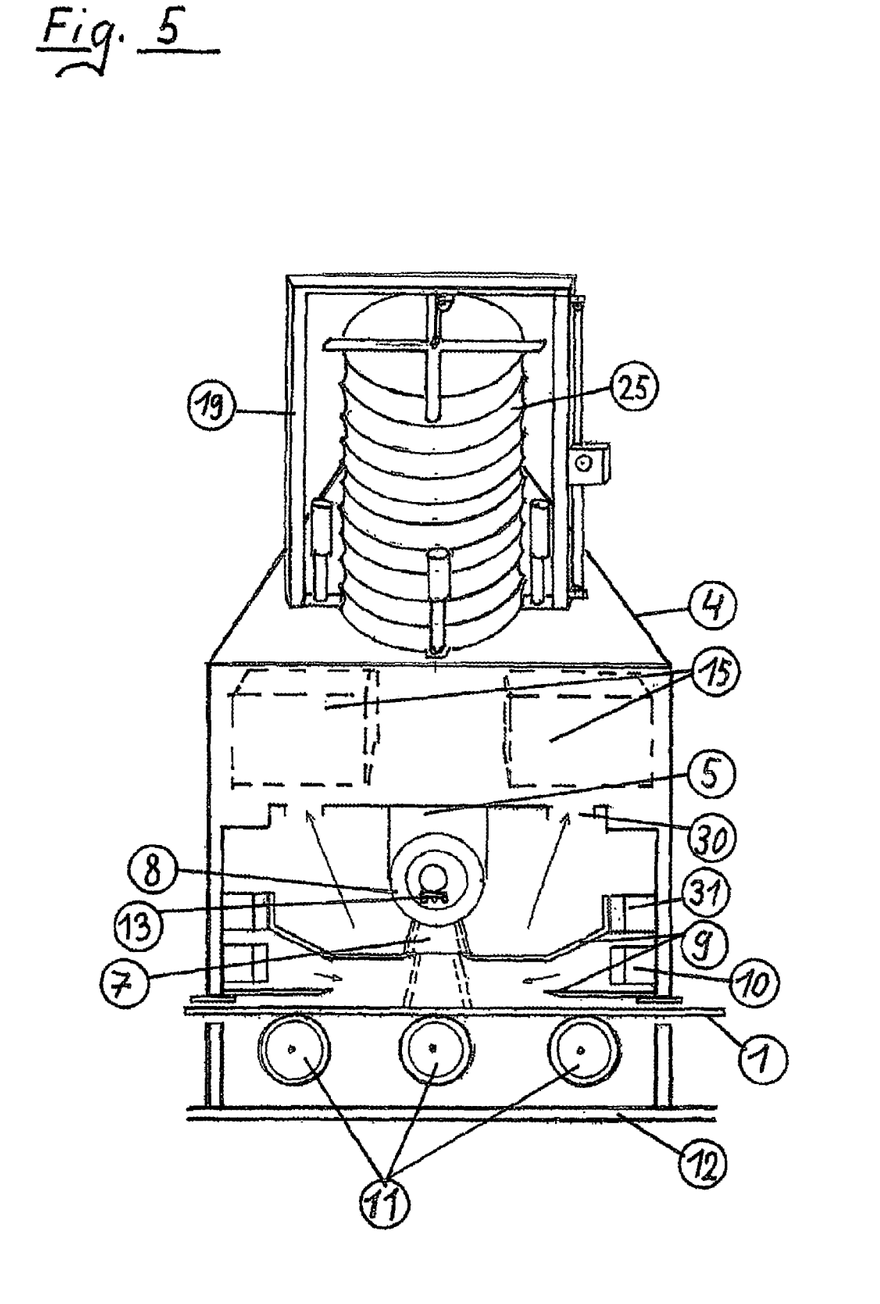
FIG. 5: shows an air reservoir 25 and a sputtering segment

FIG. 5 shows an air reservoir 25 and a sputtering segment.

In this case, a sputtering segment is illustrated on which a variable-volume air reservoir 25 is integrated. Illustrated as new reference signs here are a respective suction opening 30 on the left-hand and right-hand sides of the tank, said suction openings 30 leading to a respective vacuum pump 15. The remaining reference signs have already been described.

Furthermore, a displacement device 31 for precise adjustment of the position of a particular splash guard can be seen as a particular configuration on the right-hand side of the tank. This device 31 is also located on the left-hand side of the tank.

Such an air reservoir can preferably also be arranged an inlet chamber or a transfer chamber.

Figure 6:
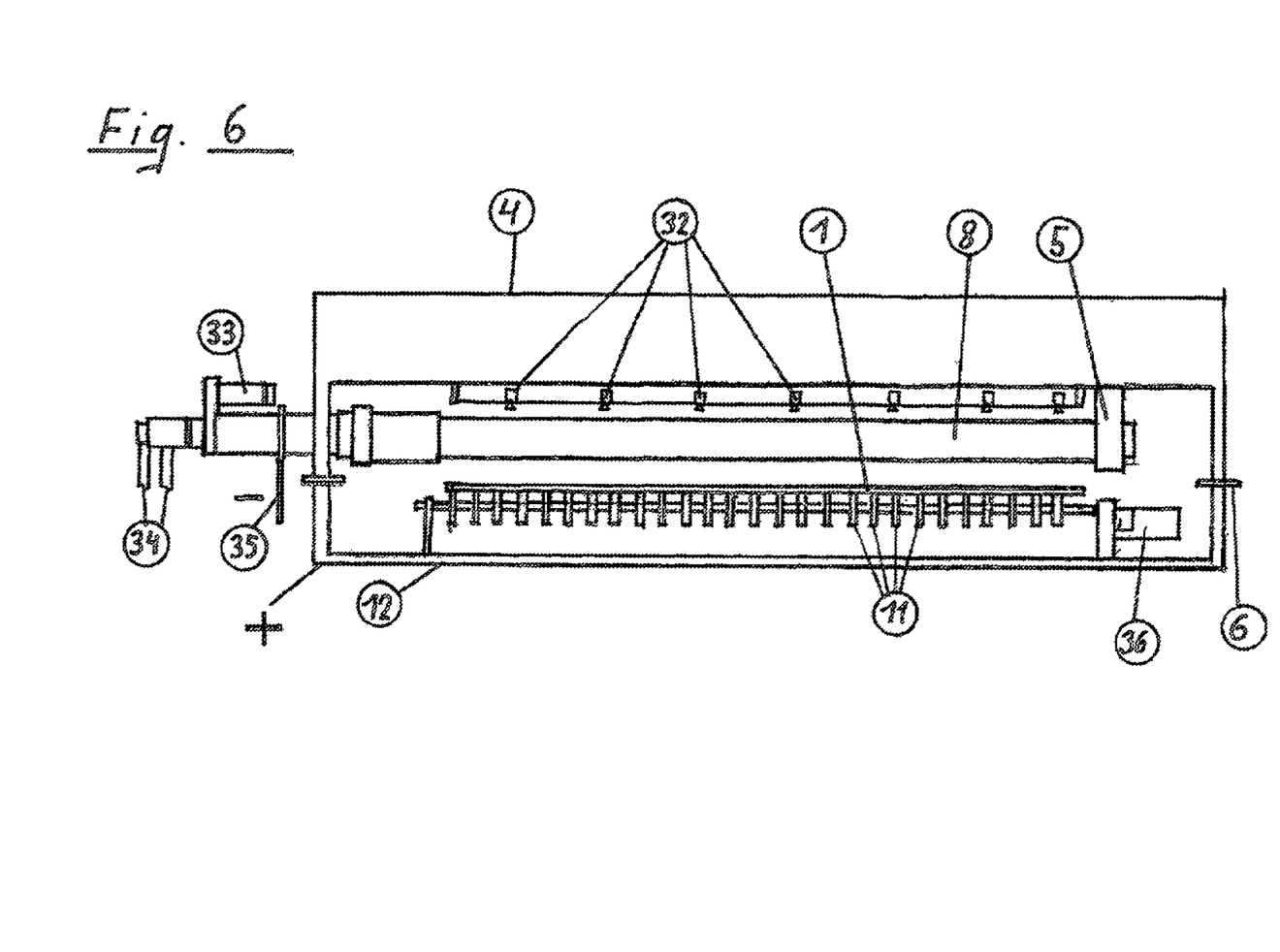
FIG. 6: shows a cross section through a target region

FIG. 6 shows a cross section through a target region.

In this FIG. 6, the flat design of the tank according to the invention in cross section can be seen particularly clearly. Besides the tank cover 4 and the tank tub 12, a cover flange 6 and the substrate plane 1 are also indicated. In order to deliver the substrates, the rollers, illustrated in section, of the transporting apparatus 11 with the transporting roller drive 36 thereof are used. The cylindrical targets 8 are mounted on the right-hand side by way of the cathode bearing block 5 and on the left-hand side by way of a corresponding mount in the tank. The target drive 33 is cooled by means of a cooling-water circuit 34. The electric power supply 35 is also located in this region. A DC voltage of up to 100 volts is applied here, wherein the positive pole bears on the housing and the negative pole on the target 8.

In order to monitor the result of the coating process, the detection elements 32 are used. In this case, the detection elements 32 can be displaced on their locating device and can be rotated with regard to their detection range regardless of location. The corresponding apparatuses are not drawn for reasons of complicated illustration.

Figure 7:
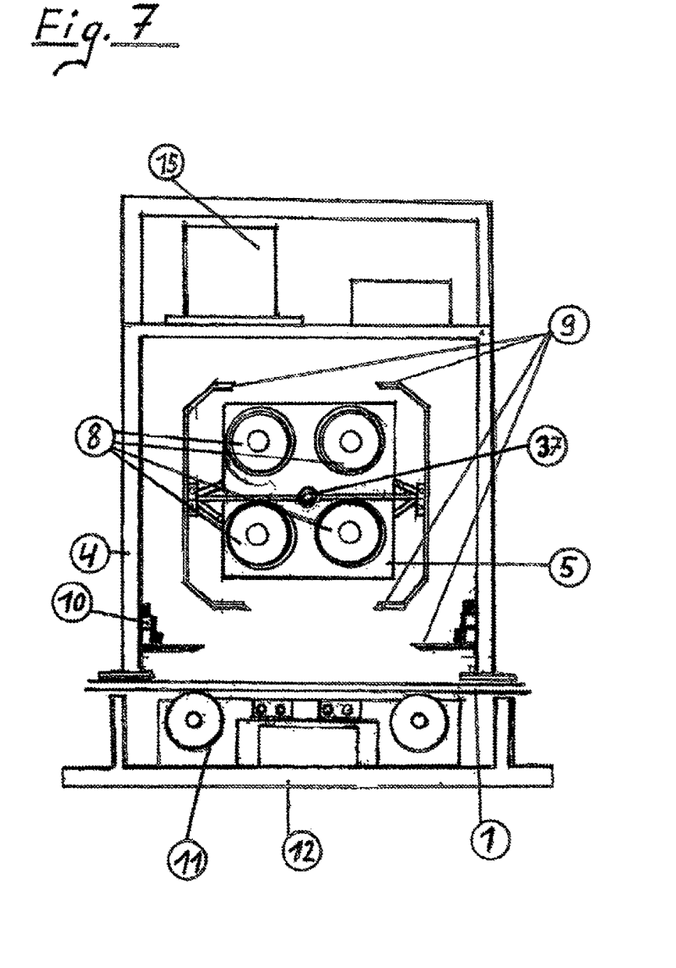
FIG. 7: shows the illustration of a multiple cathode

FIG. 7 shows the illustration of a multiple cathode.

Here, a tank tub 12 with a substrate 1, the transporting device 11 and a vacuum pump 15 is illustrated in section, having a particular configuration of a cathode bearing block 5 in the tank cover 4. Located in the middle of the tank shown here is a bearing block 5 which has a multiple cathode in the form of two normal double targets located one above the other, wherein these are mounted so as to be rotatable about a common rotation axis 37 together with their splash guards 9. This makes it possible to change two targets following erosion without it being necessary to open the respective tank. However, it is also possible to bring different kinds of targets into service during a coating process without taking any erosion into account. The gas inlet ducts 10 remain unaffected thereby.

This arrangement allows 4 engagement positions and thus four different coating configurations, each offset through 90° with respect to one another, without the splash guard and coating cathode being coupled together.

Figure 8:
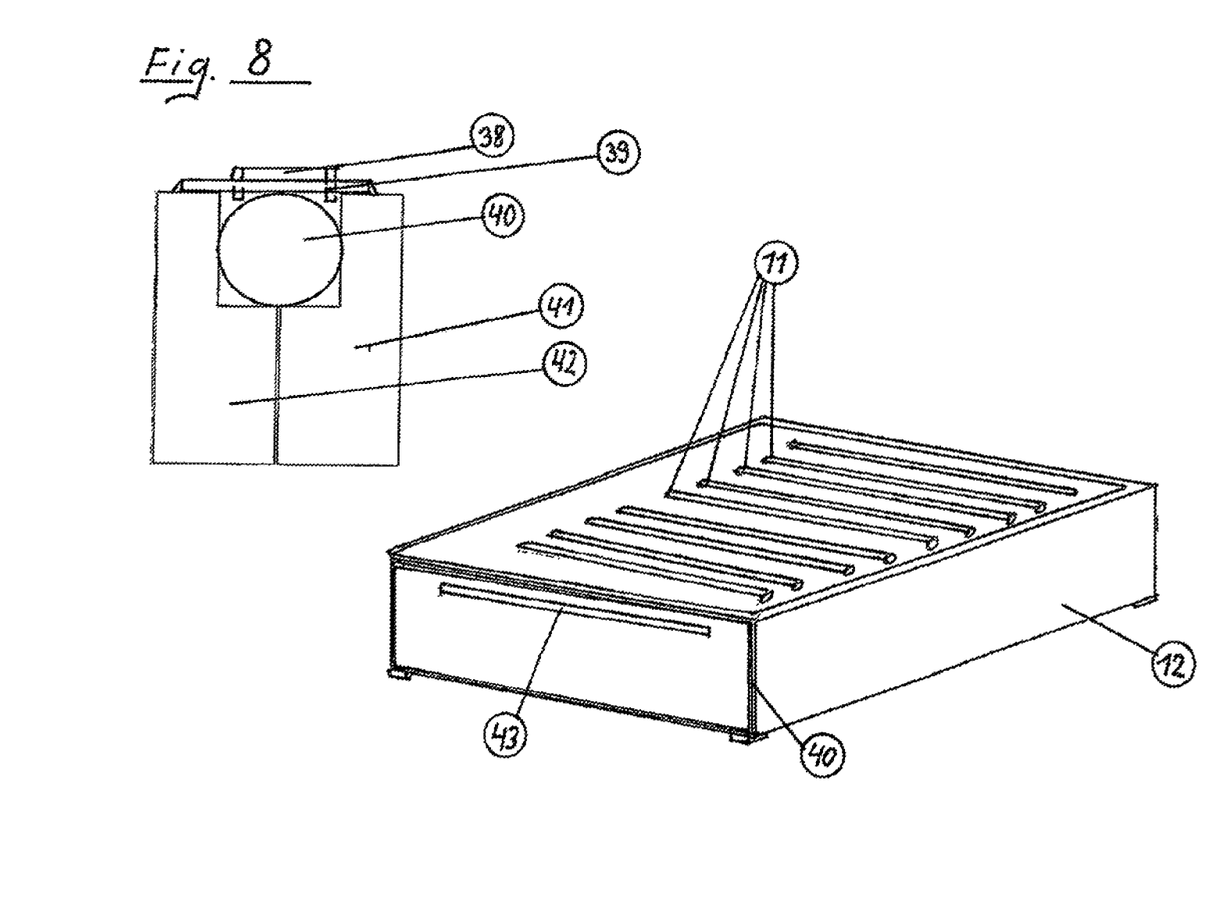
FIG. 8: shows the sealing of individual tank tubs 12

FIG. 8 shows the sealing of individual tank tubs 12.

In order to maintain the vacuum conditions during the coating process, it is necessary to create reliable sealing between the individual sputtering segments 3 and/or the gas separating segments 2, which ensures an uninterrupted connection of the individual port openings 43 of the substrate plane during the throughput of the segment to be coated.

By way of example, the connection between two chambers 41 and 42 in the form of two tanks is shown here in FIG. 8, wherein the three-dimensionally illustrated tank tub 12 with the individual running axles of its transporting device 11 has a sealing ring 40 that extends externally around the entire periphery and seals off the port opening 43.

In the detail illustration likewise shown in FIG. 8, the corner region of two chambers 41 and 42 located next to one another can be seen, which are sealed off from the exterior, in which normal air pressure prevails, by means of the sealing ring 40.

Additionally provided here is an external sealing strip 39, wherein the space between the sealing ring 40 and the sealing strip 39, illustrated in a stylized manner here, is monitored by a vacuum sensor 38.

LIST OF REFERENCE SIGNS

1 Substrate, substrate plane
2 Gas separating segments
3 Sputtering segments
4 Tank cover
5 Cathode bearing block
6 Cover flange
7 Plasma region
8 Target
9 Splash guard, sputtering region screen
10 Gas inlet ducts
11 Transporting device
12 Tank tub
13 Magnetic bar
14 Tunnel cover
15 Vacuum pump
16 Tunnel-cover flap
17 Lifting and lowering elements for a tunnel cover
18 Clearance gap
19 Reservoir gantry
20 Reservoir cover
21 Deflection roller
22 Cover cross, stop for spring elements 26
23 Tension cable
24 Tension-cable drive element
25 Variable-volume air reservoir
26 Spring element, force reinforcer in vacuum operation
27 Vacuum chamber (tank)
28 Shut-off valve
29 Tension-cable sealing element
30 Suction opening
31 Displacement device for splash guard 9
32 Detection element for monitoring coating
33 Target drive
34 Cooling-water circuit
35 Connection of the electric power supply
36 Transport-roller drive

The invention claimed is:

1. An apparatus for saving energy and simultaneously increasing the throughput speed in vacuum coating installations which consist of a sequence of sputtering segments (3) and gas separating segments (2) with a continuous substrate plane (1), having the following features:
   d) the sputtering segments (3) each consist of a tank tub (12) with an internal transporting device (11) for transporting substrates (1) and at least one tank cover (4) which is connected to the tank tub (4) by means of a tank flange (6), wherein the tank flange (6) is positioned in the immediate vicinity above the substrate plane (1) and wherein a cathode bearing block (5) with targets (8) and gas inlet ducts (10) is located in the immediate vicinity of the substrate with splash guards (9) in the tank cover (4),
   e) the gas separating segments (2) have, in the region of the substrate plane (1), a tunnel cover (14) which extends along the entire length of the gas separating segment (2) and which can be adapted to the thickness of the respective substrate (1) by means of a plurality of lifting and lowering elements (17) such that only a small clearance gap (18) remains vertically between the substrate (1) and the tunnel cover (14),
   f) sputtering segments (3) and/or gas separating segments (2) are evacuated by means of one or more vacuum pumps (15), wherein the air conveyed in the process is collected in a variable-volume air reservoir (25) and, when the relevant segment (3, 2) is subsequently aerated again, is delivered back into this segment (3, 2).

2. The apparatus as claimed in claim 1, characterized in that, in the upper region of the tank cover (4), in order to monitor the coating process, a plurality of detection elements (32) can be displaced on a locating device and can be rotated with regard to their detection range regardless of location.

3. The apparatus as claimed in claim 1, characterized in that the bearing block (5) has a multiple cathode in the form of two double targets located one above the other, wherein these are mounted so as to be rotatable about a common rotation axis (37) together with their splash guards (9), and wherein four different coating configurations are allowed.

4. The apparatus as claimed in claim 1, characterized in that in each case two chambers (41, 42) located next to one another are sealed off from the exterior by means of a sealing ring (40) that extends around the entire periphery, wherein an outer sealing strip (39) is additionally provided in this region, and wherein the space between the sealing ring (40) and the sealing strip (39) is monitored by a vacuum sensor (38).

5. A method for saving energy and simultaneously increasing the throughput speed in vacuum coating installations which consist of a sequence of sputtering segments (3) and gas separating segments (2) with a continuous substrate plane (1), having the following features:
   d) in order to carry out the method, use is made of sputtering segments (3) in which the tank flange (6) for connecting the tank tub (12) and the tank cover (4) is positioned in the immediate vicinity above the substrate plane (1) in order that, in the event of process changes and maintenance work, the entire tank cover (4) with all the components located therein can be changed quickly in a time-saving and cost-effective manner,
   e) the gas separating segments (2) are provided along their entire length with a tunnel for delimiting the respective substrate with respect to the adjoining region of the gas separating segment (2), wherein the height of the tunnel can be adapted to the thickness of the respective substrate in such a way that the location of the tunnel cover (14) is changed by means of a plurality of lifting and lowering elements (17) such that a minimum clearance gap remains between the substrate and the tunnel cover (14), f) sputtering elements (3) and/or gas separating segments (2) are evacuated by means of one or more vacuum pumps (15), wherein the air conveyed in the process is collected in a variable-volume air reservoir (25) and, when the relevant segment (3, 2) is subsequently aerated again, is delivered back into this segment (3, 2), in order that the air that has already been conditioned once can be utilized again in a time-saving and cost-effective manner.

6. The method as claimed in claim 5, characterized in that, in order to monitor the coating process in real time, in the upper region of the tank cover (4), in order to monitor the coating process, a plurality of detection elements (32) can be displaced on a locating device and can be rotated with regard to their detection range regardless of location.

7. The method as claimed in claim 5, characterized in that, in order to optimize the coating process, the bearing block (5) has a multiple cathode in the form of two double targets located one above the other, wherein these are mounted so as to be rotatable about a common rotation axis (37) together with their splash guards (9).

8. A computer program having a program code for carrying out the method steps as claimed in claim 5 when the program is run on a computer.

9. A machine-readable carrier having the program code of a computer program for carrying out the method as claimed in claim 5 when the program is run on a computer.

* * * * *